United States Patent
Tomita et al.

(10) Patent No.: US 7,896,970 B2
(45) Date of Patent: Mar. 1, 2011

(54) SEMICONDUCTOR SUBSTRATE CLEANING LIQUID AND SEMICONDUCTOR SUBSTRATE CLEANING PROCESS

(75) Inventors: Hiroshi Tomita, Tokyo (JP); Yuji Yamada, Tokyo (JP); Hiroaki Yamada, Tokyo (JP); Norio Ishikawa, Saitama (JP); Yumiko Abe, Saitama (JP)

(73) Assignees: Kabushiki Kaisha Toshiba, Tokyo (JP); Kanto Kagaku Labushiki Kaisha, Tokyo (JP)

( * ) Notice: Subject to any disclaimer, the term of this patent is extended or adjusted under 35 U.S.C. 154(b) by 745 days.

(21) Appl. No.: 11/893,752

(22) Filed: Aug. 16, 2007

(65) Prior Publication Data

US 2007/0295366 A1  Dec. 27, 2007

Related U.S. Application Data

(62) Division of application No. 11/201,910, filed on Aug. 10, 2005, now abandoned.

(30) Foreign Application Priority Data

Aug. 10, 2004  (JP) .............................. 2004-233670

(51) Int. Cl.
  H01L 21/02  (2006.01)
(52) U.S. Cl. .............................. 134/1.3; 134/3; 510/175
(58) Field of Classification Search ................... 134/1.3, 134/3; 510/175
  See application file for complete search history.

(56) References Cited

U.S. PATENT DOCUMENTS

| | | | |
|---|---|---|---|
| 3,998,707 A | 12/1976 | Fong | |
| 4,057,503 A | 11/1977 | Graver et al. | |
| 4,328,304 A | 5/1982 | Tachikawa et al. | |
| 4,377,487 A | 3/1983 | Freeman | |
| 4,904,309 A | 2/1990 | Komabashiri et al. | |
| 5,290,361 A | 3/1994 | Hayashida et al. | |
| 5,560,857 A | 10/1996 | Sakon et al. | |
| 5,885,362 A * | 3/1999 | Morinaga et al. ............... 134/2 |
| 5,958,399 A | 9/1999 | Sonderfan et al. | |
| 6,309,698 B1 | 10/2001 | Uesugi et al. | |
| 6,323,169 B1 | 11/2001 | Abe et al. | |
| 6,540,935 B2 | 4/2003 | Lee et al. | |
| 6,637,334 B2 | 10/2003 | Akiyama et al. | |
| 6,730,644 B1 * | 5/2004 | Ishikawa et al. ............. 510/175 |
| 6,846,336 B1 | 1/2005 | Gerle et al. | |
| 7,026,096 B2 | 4/2006 | Hotta | |
| 2001/0010891 A1 | 8/2001 | Hotta et al. | |
| 2002/0055447 A1 | 5/2002 | Ishikawa et al. | |
| 2003/0144163 A1 | 7/2003 | Morinaga et al. | |
| 2003/0212181 A1 | 11/2003 | Honda et al. | |
| 2003/0224281 A1 | 12/2003 | Ishizuka et al. | |
| 2004/0053167 A1 | 3/2004 | Hotta | |
| 2004/0167047 A1 * | 8/2004 | Ishikawa et al. ............. 510/175 |
| 2004/0204329 A1 | 10/2004 | Abe et al. | |
| 2004/0244300 A1 * | 12/2004 | Ichiki et al. ................... 51/307 |
| 2005/0287480 A1 * | 12/2005 | Takashima ................... 430/331 |

FOREIGN PATENT DOCUMENTS

| | | |
|---|---|---|
| CN | 1061040 A | 5/1992 |
| JP | 01-310356 A | 12/1989 |
| JP | 5-275405 | 10/1993 |
| JP | 06-041770 | 2/1994 |
| JP | 06-132267 | 5/1994 |
| JP | 7-115077 A | 5/1995 |
| JP | 09-151394 A | 6/1997 |
| JP | 09/283480 A | 10/1997 |
| JP | 2000-049132 | 2/2000 |
| JP | 2001-7071 A | 1/2001 |
| JP | 2003-109930 | 4/2003 |
| JP | 2003-221600 A | 8/2003 |
| JP | 2003-297792 A | 10/2003 |

* cited by examiner

*Primary Examiner*—Gregory E Webb
(74) *Attorney, Agent, or Firm*—Edwards Angell Palmer & Dodge LLP; Peter F. Corless; Nicholas J. DiCeglie

(57) ABSTRACT

A semiconductor substrate cleaning liquid composition is provided that includes one or more types selected from the group consisting of a compound having at least two sulfonic acid groups per molecule, phytic acid, and a condensed phosphoric acid compound; an inorganic acid; and water. There is also provided a process for cleaning a semiconductor substrate that includes a first step of cleaning the semiconductor substrate using the semiconductor substrate cleaning liquid composition and, subsequent to the first step, a second step of cleaning the semiconductor substrate with pure water, ozone water formed by dissolving ozone gas in pure water, or aqueous hydrogen peroxide.

10 Claims, No Drawings

# SEMICONDUCTOR SUBSTRATE CLEANING LIQUID AND SEMICONDUCTOR SUBSTRATE CLEANING PROCESS

CROSS-REFERENCE TO RELATED APPLICATIONS

This application is a divisional of U.S. patent application Ser. No. 11/201,910 filed Aug. 10, 2005, which claims priority from Japanese Patent Application Number 2004-233670 filed Aug. 10, 2004.

BACKGROUND OF THE INVENTION

1. Field of the Invention

The present invention relates to a cleaning liquid and a cleaning process and, in particular, to a cleaning liquid and a cleaning process for the surface of a silicon, etc. semiconductor substrate.

The present invention also relates to a cleaning liquid used in particular for a pre-wiring pattern formation step, called a pre-step (Front End Of Line, hereinafter abbreviated to FEOL), in a semiconductor fabrication process.

2. Description of the Related Art

Accompanying the increasing integration of ICs, since a trace amount of impurity affects the performance and yield of a device, strict contamination control is required. That is, there is a demand for strict control of contamination of a substrate, and various types of cleaning liquids are used in various steps of semiconductor fabrication.

The semiconductor fabrication process can be roughly divided into FEOL, which is a transistor formation step, and a back end step (Back End Of Line, generally abbreviated to BEOL), which is a wiring formation step.

In general, as semiconductor substrate cleaning liquids for FEOL use prior to the formation of a wiring pattern, aqueous ammonia-aqueous hydrogen peroxide-water (SC-1 cleaning liquid) for the purpose of removing particles; hydrochloric acid-aqueous hydrogen peroxide-water (SC-2 cleaning liquid) or dilute hydrofluoric acid for the purpose of removing metals; sulfuric acid-aqueous hydrogen peroxide, sulfuric acid-ozone-water, ozone-water, or the SC-1 cleaning liquid for the purpose of removing organic substances; hydrofluoric acid-ammonium fluoride-water, dilute hydrofluoric acid, hydrofluoric acid-aqueous hydrogen peroxide-water for the purpose of removing an oxide film, etc., are used singly or in a combination of a plurality of types of cleaning liquids according to the intended application.

As a step for removing all of microparticles, organic substances, and metals, a cleaning step such as RCA cleaning, or its improved version SC-1 cleaning→dilute hydrofluoric acid cleaning→SC-2 cleaning, is employed, but they have the problems that the number of steps is large, and accompanying the recent increase in fineness and density of semiconductor devices, there is an increasing demand for lowering residual microparticles; at the same time the formation of thin films of materials is advancing, and the amount of etching of the silicon substrate or a thermally oxidized film by a liquid reagent is strictly restricted so as to be not more than 0.1 nm. Accordingly, since the SC-1 cleaning liquid cannot remove fine microparticles sufficiently, and an alkaline base such as ammonia causes a large degree of etching of the substrate, there have been attempts to improve the cleaning properties, suppress the amount of etching, and lower the ammonia concentration and the cleaning temperature by the addition of various types of compounds. As such improvement techniques, the following have been reported.

A composition has been disclosed in which a phosphonic acid-based or condensed phosphoric acid compound-based chelating agent is added to the SC-1 cleaning liquid, the composition being capable of suppressing not only microparticles but also metals from adsorbing on a substrate in an alkaline region, and decreasing the amounts of Fe, Al, and Zn metal remaining on the substrate after SC-1 cleaning (JP, A, 5-275405), but this composition does not improve the removability of microparticles compared with the SC-1 cleaning liquid, and does not suppress the amount of etching of the substrate.

Furthermore, it is reported that by adding, to the SC-1 cleaning liquid, an ethylene oxide adduct type surfactant or a chelating agent it is possible to enhance the removability of microparticles such as silicon nitride and silica particles and reduce the amounts of Fe and Cu remaining on the surface of a substrate after SC-1 cleaning to $10^9$ atom/cm$^2$ or less at a temperature of 70° C., and the amount of etching of the substrate is equal to or less than 1 nm (JP, A, 2003-221600), but since the surface of the silicon substrate is oxidized by hydrogen peroxide, it might be necessary to carry out a step of removing the oxide film, and since the liquid is alkaline it cannot satisfy the standard for the amount of etching to be 0.1 nm or less that has accompanied the recent increase in fineness of semiconductor devices; furthermore, it is difficult to remove alumina particles, which have an equipotential point on the alkaline side.

Moreover, although it is not based on the SC-1 cleaning liquid, a composition obtained by adding a specified nonionic surfactant to an aqueous solution of ammonium hydroxide has been disclosed as an alkaline aqueous solution, the composition having excellent removability for particles formed from dirt and dust in the atmosphere without corroding a silicon substrate (JP, A, 2003-109930), but suppression of the amount of etching is not sufficient, and even when it is used with a substrate for which etching is not a problem, the metal removability and the removability of particles such as silica particles, alumina particles, and silicon nitride particles have not been confirmed.

On the other hand, it has been reported that a more neutral aqueous solution obtained by adding an anionic surfactant to a solution prepared by mixing acetic acid and aqueous ammonia to give a pH of 5.0 can improve the removability of particles of Al, W, and Fe (JP, A, 6-132267). In accordance with this technique, it can be expected that there will be no problems with regard to the etching properties of the silicon substrate, but the metal removability has not been confirmed, and there have been no reports concerning the removability of particles such as silica particles, alumina particles, or silicon nitride particles, or the adsorption of organic components on the substrate.

Furthermore, it has been reported in an experiment employing polystyrene microparticles that the number of attached particles can be decreased using an acidic aqueous solution employing an inorganic acid obtained by adding an anionic surfactant to an aqueous solution of hydrofluoric acid, etc., and the larger the absolute value of the zeta potential, which is a negative value, the smaller the number of attached particles (JP, A, 6-41770), but when it is based on hydrofluoric acid there is the problem of etching of the substrate, and even when it is used with a substrate for which etching is not a problem there have been no reports concerning metal removability or the removability of particles such as silica particles, alumina particles, or silicon nitride particles, which are more difficult to remove than polystyrene microparticles.

Moreover, it has been reported by the present inventors that, as an acidic aqueous solution employing an organic acid, a composition obtained by adding at least one of a dispersant and a surfactant can remove silica particles and alumina particles effectively and can suppress the concentration of Fe adsorption after cleaning (JP, A, 2001-7071), but there has been no report concerning the removability of silicon nitride particles.

Furthermore, accompanying the recent problem of a cleaning liquid component being adsorbed on a substrate, a method has been reported in which an organic acid and an organic substance adsorbed on the substrate surface are decomposed and removed by cleaning with water containing ozone (JP, A, 2000-49132), but since cleaning is carried out with an aqueous solution of an organic acid and hydrofluoric acid in order to remove metal impurities, microparticles, and organic substances, the problem of the substrate being etched by hydrofluoric acid is not solved, and even when it is used with a substrate for which etching is not a problem, there have been no disclosures in relation to the removal of particles.

Although various types of cleaning liquids have been developed as described above, there are no reports of a cleaning liquid and cleaning process for FEOL that do not etch a silicon substrate, can simultaneously remove silica particles, alumina particles, and silicon nitride particles even when they are used with a substrate for which etching is not a problem, and suppress the adsorption of metals on the substrate after cleaning.

SUMMARY OF THE INVENTION

That is, it is an object of the present invention to eliminate the problems of the conventional techniques and to develop a cleaning liquid that can simultaneously remove metal contamination and particulate contamination by silica particles, alumina particles, and silicon nitride particles, that does not cause a substrate to be etched, and that suppresses the adsorption of an organic component on a substrate during cleaning, and a cleaning process that can remove an organic component adsorbed on a substrate during cleaning of the substrate.

As a result of an investigation by the present inventors into the removal of particulate contamination by means of an additive using a liquid based on an inorganic acid such as hydrochloric acid, it has been found that a cleaning liquid formed by adding a compound having at least two sulfonic acid groups per molecule, phytic acid, or a condensed phosphoric acid compound to an aqueous solution of an inorganic acid such as hydrochloric acid exhibits high removability toward silica particles, alumina particles, and silicon nitride particles at room temperature without etching a substrate, and adequately suppresses the amount of metal adsorbing on the substrate after cleaning, and it has been found that the amount of an organic component adsorbed on the substrate can be further decreased by a process involving cleaning with the cleaning liquid, followed by the use of ozone water or aqueous hydrogen peroxide; furthermore, it has been found that, with regard to a substrate for which etching is not a problem, addition of hydrofluoric acid can improve the removability of microparticles and, moreover, it has been found that, by subjecting the substrate to a treatment with ozone water or aqueous hydrogen peroxide prior to cleaning with the present cleaning liquid composition, it is possible to make the substrate surface hydrophilic and suppress the amount of organic component adsorbing on the substrate surface; and as a result of a further investigation the present invention has been accomplished.

That is, the present invention relates to a semiconductor substrate cleaning liquid composition comprising one or more types selected from the group consisting of a compound having at least two sulfonic acid groups per molecule, phytic acid, and a condensed phosphoric acid compound; an inorganic acid; and water.

Furthermore, the present invention relates to the semiconductor substrate cleaning liquid composition, wherein the compound having at least two sulfonic acid groups per molecule is a condensate between naphthalenesulfonic acid and formaldehyde.

The present invention relates to the semiconductor substrate cleaning liquid composition, wherein the inorganic acid is one or more types selected from the group consisting of hydrochloric acid, sulfuric acid, nitric acid, phosphoric acid, and perchloric acid.

Furthermore, the present invention relates to the semiconductor substrate cleaning liquid composition, wherein said one or more types selected from the group consisting of a compound having at least two sulfonic acid groups per molecule, phytic acid, and a condensed phosphoric acid compound is in the range of 0.00001 to 10 mass % as a total.

Furthermore, the present invention relates to the semiconductor substrate cleaning liquid composition, wherein it further comprises hydrofluoric acid.

Moreover, the present invention relates to a composition comprising one or more types selected from the group consisting of a compound having at least two sulfonic acid groups per molecule, phytic acid, and a condensed phosphoric acid compound; an inorganic acid; and water, the composition having water further added thereto to give the above-mentioned semiconductor substrate cleaning liquid.

Furthermore, the present invention relates to a process for cleaning a semiconductor substrate, the process comprising a first step of cleaning the semiconductor substrate using a semiconductor substrate cleaning liquid composition comprising one or more types selected from the group consisting of a compound having at least two sulfonic acid groups per molecule, phytic acid, and a condensed phosphoric acid compound; an inorganic acid; and water, and, subsequent to the first step, a second step of cleaning the semiconductor substrate with pure water, ozone water formed by dissolving ozone gas in water, or aqueous hydrogen peroxide.

The present invention moreover relates to the process for cleaning a semiconductor substrate, wherein the first step is carried out in two steps comprising a) cleaning with an aqueous solution comprising one or more types of inorganic acid and b) cleaning with an aqueous solution comprising one or more types selected from the group consisting of a compound having at least two sulfonic acid groups per molecule, phytic acid, and a condensed phosphoric acid compound.

The present invention relates to the process for cleaning a semiconductor substrate, wherein the compound having at least two sulfonic acid groups per molecule is a condensate between naphthalenesulfonic acid and formaldehyde.

Furthermore, the present invention relates to the process for cleaning a semiconductor substrate, wherein the inorganic acid is one or more types selected from the group consisting of hydrochloric acid, sulfuric acid, nitric acid, phosphoric acid, and perchloric acid.

Moreover, the present invention relates to the process for cleaning a semiconductor substrate, wherein said one or more types selected from the group consisting of a compound having at least two sulfonic acid groups per molecule, phytic acid, and a condensed phosphoric acid compound is in the range of 0.00001 to 10 mass % as a total.

The present invention furthermore relates to the process for cleaning a semiconductor substrate, wherein the first step is carried out by heating.

The present invention relates to the process for cleaning a semiconductor substrate, wherein prior to the first step cleaning is carried out with ozone water formed by dissolving ozone gas in pure water, or aqueous hydrogen peroxide.

Furthermore, the present invention relates to the process for cleaning a semiconductor substrate, wherein between the first step and the second step cleaning is carried out with pure water.

Moreover, the present invention relates to the process for cleaning a semiconductor substrate, wherein prior to the first step cleaning is carried out with hydrofluoric acid.

Furthermore, the present invention relates to the process for cleaning a semiconductor substrate, wherein the semiconductor substrate cleaning liquid composition of the first step further comprises hydrofluoric acid.

Moreover, the present invention relates to the process for cleaning a semiconductor substrate, wherein the semiconductor substrate cleaning liquid composition of the first step further comprises hydrogen peroxide.

Furthermore, the present invention relates to the process for cleaning a semiconductor substrate, wherein the process employs a composition obtained by further adding water to the composition comprising one or more types selected from the group consisting of a compound having at least two sulfonic acid groups per molecule, phytic acid, and a condensed phosphoric acid compound; an inorganic acid; and water.

By virtue of synergy between an inorganic acid and one or more types selected from the group consisting of a compound having at least two sulfonic acid groups per molecule, phytic acid, and a condensed phosphoric acid compound, the present invention exhibits excellent operational effects such as various types of microparticles and metals being removed without etching a substrate, and adsorption of organic components on the substrate being suppressed. Although the mechanism thereof is not necessarily clear, it is surmised that, since a compound having at least two sulfonic acid groups per molecule, phytic acid, a condensed phosphoric acid compound, etc. have, per molecule, a plurality of functional groups (sulfonic acid groups or phosphoric acid groups), which become adsorption sites, when a semiconductor substrate is cleaned they adsorb in a stable manner on the substrate, various types of films, and microparticles attached thereto, thus imparting a negative charge thereto and causing electrical repulsion between the microparticles and both the substrate and the various types of films, and thereby removing the particles from the substrate.

The substrate in this case is mainly an Si substrate, or an Si substrate having a structure in which there are various types of films such as an SiN film, an $SiO_2$ film, a Poly Si film, an $Al_2O_3$ film, etc. on the Si substrate. This mechanism might be thought to apply to a combination with either an inorganic acid or an organic acid, but since an organic acid has a carboxyl group and adsorbs on the Si substrate or particles in the same manner as does said one or more types selected from the group consisting of a compound having at least two sulfonic acid groups per molecule, phytic acid, and a condensed phosphoric acid compound, adsorption of the organic acid on the particles and the substrate occurs competitively with adsorption of the above compounds, thus inhibiting these compounds from adsorbing. It is therefore thought that the combination with an inorganic acid can remove the microparticles more effectively.

Furthermore, in the present invention, the compound having at least two sulfonic acid groups per molecule, phytic acid, the condensed phosphoric acid compound, etc. adsorb on the substrate and cause contamination by the organic substances depending on the amount thereof adsorbed, but compared with a conventional cleaning liquid comprising an aqueous solution of an organic acid, the concentration of the organic substances is low, and the burden on the environment is small. Moreover, when the cleaning process employing ozone water or aqueous hydrogen peroxide of the present invention is carried out continuously, since this organic substance contamination is decomposed and removed by ozone or hydrogen peroxide, the organic substance contamination can be suppressed to below the detection limit.

Furthermore, in the actual step, there are cases in which some degree of etching of a base such as an oxide film or a nitride film is acceptable, and in this case by adding hydrofluoric acid at a low concentration to the present cleaning liquid composition, particles can be removed efficiently.

Moreover, by providing a step employing a low concentration aqueous solution of hydrofluoric acid prior to the step employing the present cleaning liquid composition, particles can be removed efficiently.

When as a pre-step to the step employing the present cleaning liquid composition there is a step employing an aqueous solution of hydrofluoric acid, etc., which makes the substrate surface hydrophobic, it might be expected that the amount of organic substance adsorbing would increase, but in such a case by providing a step in which cleaning is carried out with ozone water or aqueous hydrogen peroxide immediately prior to the cleaning step with the present cleaning liquid composition, the substrate surface can be made hydrophilic and the amount of organic substance adsorbing can be suppressed.

EFFECTS OF THE INVENTION

The inorganic acid used for preparation of the cleaning liquid of the present invention employs one or more types selected from the group consisting of sulfuric acid, nitric acid, phosphoric acid, and perchloric acid, all of which are acids that do not corrode a silicon substrate or a glass substrate, and the composition of the present invention therefore does not etch the silicon substrate or the glass substrate.

Furthermore, the composition of the present invention can remove various types of particles such as silica particles, which have an equipotential point on the acid side, silicon nitride particles, which have a nearly neutral equipotential point, and alumina particles, which have an equipotential point on the alkaline side.

In addition, when hydrofluoric acid is added to the present cleaning liquid composition, due to a lift-off effect obtained by lightly etching a base such as an oxide film or a nitride film, particles can be removed efficiently.

A naturally oxidized film on a silicon substrate is firstly etched by hydrofluoric acid so as to lift off particles on the naturally oxidized film, the particles thus come off the substrate, and by the action of an additive having a dispersing effect it is possible to prevent the particles from adsorbing again.

Moreover, the present invention is a process for cleaning a semiconductor substrate, the process comprising subjecting the substrate to a first step of cleaning the semiconductor substrate by means of a semiconductor substrate cleaning liquid composition comprising one or more types selected from the group consisting of a compound having at least two sulfonic acid groups per molecule, phytic acid, and a condensed phosphoric acid compound, an inorganic acid, and water and, following the first step, to a second step of cleaning the semiconductor substrate by means of pure water, ozone water in which ozone gas is dissolved, or aqueous hydrogen peroxide, and contamination of an organic substance adsorbed on the substrate surface can be easily removed by the second step.

Moreover, after treating with the present cleaning liquid composition, by treating with ozone water or aqueous hydrogen peroxide, it is possible to finish the substrate surface so that it is hydrophilic, thereby preventing the occurrence of water marks during spin drying.

Furthermore, since the total concentration of said one or more types selected from the group consisting of a compound having at least two sulfonic acid groups per molecule, phytic acid, and a condensed phosphoric acid compound used in the cleaning liquid is low, not only is adsorption thereof on the substrate suppressed, but also the burden on the environment is low.

BEST MODE FOR CARRYING OUT THE INVENTION

The cleaning liquid of the present invention is mainly used for cleaning of a semiconductor substrate, and examples of the semiconductor substrate to which it can be applied include a silicon substrate, an SiGe substrate, an SiGeC substrate, an SiC substrate, and other compound semiconductor substrates. Moreover, in addition to the silicon substrate the cleaning liquid of the present invention can be used for a glass substrate since it does not corrode a glass substrate.

The inorganic acids used in the present invention include acids that do not etch a silicon substrate, such as hydrochloric acid, sulfuric acid, nitric acid, phosphoric acid, perchloric acid, and carbonic acid, as well as an acidic water obtained by the electrolysis of water. From the viewpoint of waste liquid treatment and cost, hydrochloric acid, sulfuric acid, and nitric acid are particularly preferable since only a neutralization treatment is required.

The concentration of the acid in the cleaning liquid is 0.002 to 30 mass %, preferably 0.005 to 10 mass %, and particularly preferably 0.01 to 5.0 mass %.

When the concentration of the inorganic acid is too low, the cleaning effects cannot be exhibited sufficiently, and when a high concentration is employed, an effect commensurate with the concentration cannot be expected and it is inefficient in terms of cost.

Furthermore, in the case of a substrate for which etching is not a problem, for example, when it is acceptable for a base such as an oxide film or a nitride film to be etched to the extent of a few angstroms, by adding hydrofluoric acid at low concentration to the cleaning liquid composition of the present invention, particles can be removed efficiently. The concentration of hydrofluoric acid is preferably 0.01 to 1 mass %, and more preferably 0.02 to 0.5 mass %.

Moreover, prior to the step employing the cleaning liquid composition of the present invention, by carrying out a treatment with an aqueous solution of hydrofluoric acid having the above-mentioned concentration, particles can also be removed efficiently.

Examples of the compound having at least two sulfonic acid groups per molecule used in the present invention include a condensate between naphthalenesulfonic acid and formaldehyde and a salt thereof, polystyrenesulfonic acid and a salt thereof, polyvinylsulfonic acid and a salt thereof, and ligninsulfonic acid and a salt thereof. Among these, the condensate between naphthalenesulfonic acid and formaldehyde and a salt thereof have a high particulate contamination removability and are inexpensive, and are therefore preferable as the compound having at least two sulfonic acid groups per molecule used in the present invention.

Most of these compounds are commercially available as sodium salts, and can be used for the fabrication of a semiconductor by treating them with an ion-exchange resin, etc. so as to remove the sodium.

Phytic acid is contained in rice bran, etc., is a phosphoric acid group-containing organic compound having a chelating action, is commercially available as an industrial starting material for the purpose of food additives, etc., and can easily be obtained as a reagent.

The condensed phosphoric acid is a condensate of orthophosphoric acid, and examples thereof include pyrophosphoric acid, metaphosphoric acid, tripolyphosphoric acid, and salts thereof. Most of the salts are in the sodium salt form, but for use in the electronics industry it is preferable to employ them in the form of a free acid or an ammonium salt, which do not include a metal ion.

The concentration of the compound having at least two sulfonic acid groups per molecule, phytic acid, and the condensed phosphoric acid in the cleaning liquid is preferably 0.00001 to 10 mass %, more preferably 0.0005 to 2 mass %, and particularly preferably 0.001 to 1 mass %. When the concentration is low, the ability to remove particulate contamination is not sufficient, and when it is too high an effect commensurate therewith cannot be expected.

When cleaning is carried out using an aqueous solution of an inorganic acid to which is added the compound having at least two sulfonic acid groups per molecule, phytic acid, or the condensed phosphoric acid, there is a possibility that an organic compound such as the compound having at least two sulfonic acid groups per molecule or phytic acid might adsorb on the substrate surface. Most of the adsorbed organic compound can be removed by cleaning with pure water, but when there is a possibility that the adsorbed organic compound might remain, it is possible to remove the organic substance by cleaning the substrate using an aqueous solution to which ozone is added or aqueous hydrogen peroxide. The ozone concentration of the aqueous solution of ozone is 0.00005 to 0.0025 mass %, and preferably 0.0001 to 0.0025 mass %, and the concentration of aqueous hydrogen peroxide is 0.01 to 35 mass %, and preferably 0.1 to 10 mass %.

Although it is preferable to carry out a treatment with ozone water since there is less of a problem with oxidation of the silicon substrate surface compared with a treatment with aqueous hydrogen peroxide, when there is no need to remove an oxide film on the substrate, it is possible to use aqueous hydrogen peroxide.

Furthermore, rather than carrying out a treatment with ozone water or aqueous hydrogen peroxide immediately after the step employing the present cleaning liquid composition, if after the first step, that is, the step employing the present cleaning liquid composition, rinsing with pure water is carried out, and then the second step, that is, treatment with ozone water or aqueous hydrogen peroxide is carried out, decomposition by ozone, etc. of the present cleaning liquid composition, which contributes to dispersion of microparticles or metal, can be suppressed, thereby improving the cleaning properties.

Moreover, it is preferable to provide the step employing ozone water or aqueous hydrogen peroxide not only as a post-step to the cleaning step with the present cleaning liquid composition but also a pre-step, since it becomes possible to make the substrate surface hydrophilic, thereby preventing adsorption of organic substances from the present cleaning liquid composition.

It is preferable to use the cleaning liquid of the present invention at the above-mentioned concentration, and since a high concentration product in which the concentration of each component is 10 to 100 times the above concentration is stable, it is preferable to employ the high concentration product for storage, transport, etc., and it is also possible to use the high concentration product by diluting before use.

Cleaning with the semiconductor substrate cleaning liquid of the present invention can be carried out at room temperature, but since the cleaning liquid does not etch a semiconductor substrate under conditions of increased temperature, it is also possible to heat at 30° C. to 80° C., and preferably 50° C. to 70° C. in order to further improve the microparticle removability. In the case of immersion cleaning (batch type cleaning machine), the cleaning time is 30 sec. to 30 minutes, and preferably 1 to 15 minutes, but since the semiconductor substrate cleaning liquid of the present invention does not etch a substrate, it is possible to carry out cleaning for a long period of time according to a required degree of cleanliness. In order to efficiently eliminate microparticles removed from the semiconductor substrate, it is also possible to carry out rinsing with water instead of immersing the substrate in the present cleaning liquid composition for a long period of time, or to continue to inject the present cleaning liquid composition so as to make the microparticles overflow. It is also possible to reduce the cleaning time by applying the cleaning liquid to a single wafer cleaning system or by employing ultrasonic waves, etc.

Furthermore, in addition to carrying out heating in the step employing the present cleaning liquid composition, by carrying out heating in a pre-step, for example, in a step involving rinsing with pure water, the effect obtained by heating the present cleaning liquid composition is synergistically enhanced, thereby further improving the cleaning properties.

Moreover, when carrying out cleaning with sulfuric acid and aqueous hydrogen peroxide in order to remove a resist film or when carrying out cleaning with phosphoric acid in order to etch a silicon nitride film, the first cleaning step employing the present cleaning liquid composition may be carried out in two stages. In such a case, it is preferable to clean with an aqueous solution comprising a compound selected from a compound having at least two sulfonic acid groups per molecule, phytic acid, and a condensed phosphoric acid compound after first cleaning with an aqueous solution of an inorganic acid, since not only can a cleaning step be omitted, but also the removability of particles can be improved. It is surmised that the reason why the removability can be improved by employing the two stages is that the inorganic acid is carried over into the subsequent step and a synergistic effect of 'inorganic acid' cleaning and 'the present cleaning liquid composition' cleaning can be obtained. The aqueous solution of an inorganic acid may contain hydrogen peroxide as necessary. The concentration of the inorganic acid when the first step is carried out in two stages may be any as long as the cleaning liquid used for 'inorganic acid' cleaning is carried over into a step employing an additive so that it becomes an appropriate concentration for the cleaning liquid composition of the present invention, and it may therefore be a high concentration, for example, 85 to 98 mass % in the case of sulfuric acid and 80 to 90 mass % in the case of phosphoric acid. When sulfuric acid and hydrogen peroxide are used in combination, the concentration of hydrogen peroxide is preferably 2 to 15 mass %.

EXAMPLES

The present invention is explained in detail below by reference to Examples and Comparative Examples of the present invention, but the present invention should not be construed as being limited by these Examples.

Preparation of Cleaning Liquid

Cleaning liquids having the compositions shown in Table 1 were prepared. Other than ammonia, hydrogen peroxide, the acid, and the additive, the remainder was water.

TABLE 1

Cleaning liquid compositions

|  | Ammonia (mass %) | Hydrogen peroxide (mass %) | Acid (mass %) | Additive (mass %) |
| --- | --- | --- | --- | --- |
| Comp. Ex. 1 | 1.0 | 1.0 |  |  |
| Comp. Ex. 2 |  |  | Hydrochloric acid 0.5 |  |
| Comp. Ex. 3 |  |  | Nitric acid 1.0 |  |
| Comp. Ex. 4 |  |  | Sulfuric acid 1.0 |  |
| Comp. Ex. 5 |  |  | Perchloric acid 0.1 |  |
| Comp. Ex. 6 |  |  | Hydrochloric acid 0.1 | Dodecylbenzenesulfonic acid 0.01 |
| Comp. Ex. 7 |  |  | Hydrochloric acid 0.5 | Polyoxyethylene nonylphenyl ether sulfonic acid 0.1 |
| Comp. Ex. 8 |  |  | Nitric acid 1.0 | Ethylene glycol propylene glycol block copolymer 0.01 |
| Comp. Ex. 9 |  |  |  | Condensate between naphthalenesulfonic acid and formaldehyde 0.01 |
| Ex. 1 |  |  | Hydrochloric acid 0.1 | Condensate between naphthalenesulfonic acid and formaldehyde 0.01 |
| Ex. 2 |  |  | Hydrochloric acid 0.5 | Phytic acid 0.01 |
| Ex. 3 |  |  | Sulfuric acid 1.0 | Condensate between naphthalenesulfonic acid and formaldehyde 0.001 |
| Ex. 4 |  |  | Nitric acid 0.01 | Metaphosphoric acid 0.01 |
| Ex. 5 |  |  | Nitric acid 1.0 | Ligninsulfonic acid 0.001 |

TABLE 1-continued

Cleaning liquid compositions

| | Ammonia (mass %) | Hydrogen peroxide (mass %) | Acid (mass %) | Additive (mass %) |
|---|---|---|---|---|
| Ex. 6 | | | Nitric acid 0.1 | Condensate between naphthalenesulfonic acid and formaldehyde 0.1 |
| Ex. 7 | | | Phosphoric acid 2.0 | Polystyrenesulfonic acid 1.0 |
| Ex. 8 | | | Perchloric acid 3.0 | Metaphosphoric acid 0.001 |
| Ex. 9 | | | Hydrochloric acid 0.5 | Metaphosphoric acid 0.0001 |
| Ex. 10 | | | Hydrochloric acid 5.0 | Condensate between naphthalenesulfonic acid and formaldehyde 0.01 |

Evaluation Test 1: Etching Properties of a Silicon Oxide Film and a Polysilicon Film by Cleaning Liquids Silicon substrates equipped with an oxide film were immersed in cleaning liquids of a Comparative Example and Examples at 25° C. for 60 minutes, film thicknesses before and after the immersion were measured using an interference type film thickness meter, and the amounts of etching of the oxide film and a polysilicon film by the cleaning liquid were compared. The results are given in Table 2.

TABLE 2

Etching properties of substrates by cleaning liquids

| | Silicon oxide film | Polysilicon |
|---|---|---|
| | | Units nm/min |
| Comp. Ex. 1 | 0.14 | 0.17 |
| Ex. 1 | 0.0 | 0.0 |
| Ex. 4 | 0.0 | 0.0 |

An SC-1 cleaning liquid of Comparative Example 1 etched the silicon oxide film and the polysilicon film, but the cleaning liquid of the present invention did not etch the silicon oxide film or the polysilicon film.

Evaluation Test 2: Cleaning of Particulate Contamination

Liquids were prepared by separately dispersing silica particles, alumina particles, and silicon nitride particles and were applied to silicon wafers using a spinner so as to contaminate the surface of the wafers with each type of particle. After the number of particles on the surface of the wafers was measured using a Surscan4500 wafer surface test system (manufactured by KLA-Tencor Corporation), the wafers were immersed in the cleaning liquids of Comparative Examples and Examples at 25° C. for 3 minutes. Each wafer was subsequently rinsed with running superpure water and dried, the number of particles on the surface was then measured using the wafer surface test system, and the ability to remove each type of particle was thus evaluated.

The results are given in Tables 3 to 5.

[Table 3]

TABLE 3

Removal ability of silica particles

| Cleaning liquid | Initial (count) | After treatment (count) | Proportion removed (%) |
|---|---|---|---|
| Comp. Ex. 1 | 9573 | 8840 | 7.7 |
| Comp. Ex. 2 | 9440 | 3057 | 67.6 |
| Comp. Ex. 3 | 10591 | 2511 | 76.3 |
| Comp. Ex. 6 | 11599 | 10370 | 10.6 |
| Comp. Ex. 7 | 9275 | 8440 | 9.0 |
| Comp. Ex. 8 | 9839 | 9104 | 7.5 |
| Ex. 1 | 10062 | 1836 | 81.7 |
| Ex. 2 | 11777 | 2051 | 82.6 |
| Ex. 5 | 9707 | 2102 | 78.3 |
| Ex. 6 | 11605 | 1815 | 84.3 |
| Ex. 7 | 10407 | 2012 | 80.7 |
| Ex. 8 | 10330 | 1820 | 82.4 |

[Table 4]

TABLE 4

Removal ability of alumina particles

| Cleaning liquid | Initial (count) | After treatment (count) | Proportion removed (%) |
|---|---|---|---|
| Comp. Ex. 1 | 8723 | 7173 | 17.8 |
| Comp. Ex. 3 | 9295 | 9083 | 2.3 |
| Comp. Ex. 4 | 12129 | 11948 | 3.4 |
| Comp. Ex. 5 | 11634 | 11440 | 1.7 |
| Comp. Ex. 7 | 11247 | 8004 | 28.8 |
| Comp. Ex. 8 | 11840 | 12211 | Increased |
| Comp. Ex. 9 | 11703 | 4901 | 58.1 |
| Ex. 1 | 10905 | 2431 | 77.7 |
| Ex. 3 | 11346 | 2866 | 74.7 |
| Ex. 6 | 12972 | 1347 | 89.6 |
| Ex. 7 | 11557 | 3731 | 67.7 |
| Ex. 8 | 11076 | 1256 | 88.7 |
| Ex. 9 | 10056 | 3002 | 70.1 |
| Ex. 10 | 11723 | 2778 | 76.3 |

[Table 5]

TABLE 5

Removal ability of silicon nitride particles

| Cleaning liquid | Initial (count) | After treatment (count) | Proportion removed (%) |
|---|---|---|---|
| Comp. Ex. 1 | 12544 | 11961 | 4.7 |
| Comp. Ex. 4 | 10572 | 10538 | 0.3 |
| Comp. Ex. 6 | 10401 | 10309 | 0.9 |
| Comp. Ex. 8 | 10004 | 10010 | Increased |
| Ex. 1 | 11795 | 6247 | 48.1 |
| Ex. 4 | 10182 | 4827 | 52.6 |
| Ex. 5 | 9638 | 5572 | 40.8 |
| Ex. 7 | 10290 | 5199 | 49.5 |
| Ex. 8 | 11783 | 6275 | 46.7 |
| Ex. 9 | 10315 | 6199 | 39.9 |
| Ex. 10 | 8999 | 5706 | 37.0 |

Evaluation Test 3: Cleaning of Metals

A liquid containing on the order of $10^{13}$ atoms/cm$^2$ of Mg, Ca, Fe, Ni, Cu, and Zn was prepared and applied to silicon wafers using a spinner so as to contaminate the surface of the wafers, and the wafers were then immersed in the cleaning liquids of Comparative Examples 2 and 9 and Example 1 at 25° C. for 3 min. Each of the wafers was subsequently rinsed with running superpure water, dried, and then subjected to measurement of the surface concentration of Ca, Fe, Ni, Cu, and Zn using a TREX610T total reflection X-ray fluorescence system (manufactured by Technos IT Co., Ltd.). Mg was subsequently recovered from each of the wafers by a droplet decomposition method using an aqueous solution of hydrofluoric acid, and the concentration of Mg was analyzed by ICP-MS. The ability to remove each metal was evaluated by these procedures. The results are given in Table 6.

[Table 6]

TABLE 6

Results of cleaning of metal contamination

| | Metal concentration on surface of the wafer ($\times 10^{10}$ atoms/cm$^2$) | | | | | |
|---|---|---|---|---|---|---|
| | Mg | Ca | Fe | Ni | Cu | Zn |
| Prior to cleaning | 7000 | 3600 | 2600 | 3500 | 5600 | 2900 |
| Comp. Ex. 2 | 1.0↓ | 6.2 | 1.7 | 0.2↓ | 0.7 | 0.3↓ |
| Comp. Ex. 9 | 1.0↓ | 4.1 | 56.0 | 0.2↓ | 11.9 | 0.3↓ |
| Ex. 1 | 1.0↓ | 5.1 | 2.1 | 0.2↓ | 0.4 | 0.3↓ |

The removability of metal contamination was not degraded by the addition of one or more types selected from the group consisting of a compound having at least two sulfonic acid groups per molecule, phytic acid, and a condensed phosphoric acid compound, and good removability of particulate contamination and metal contamination was observed.

In accordance with the cleaning process employing the above-mentioned cleaning liquid, particles on the semiconductor substrate can be removed effectively. Furthermore, compared with rinsing with pure water without carrying out cleaning with ozone water or aqueous hydrogen peroxide, the present invention enables the amount of carbon adsorbed on a semiconductor substrate to be decreased by carrying out cleaning with ozone water or aqueous hydrogen peroxide after cleaning with the above-mentioned cleaning liquid. Specifically, if a semiconductor substrate is cleaned with the cleaning liquid of the present invention and then rinsed with pure water, because of the use of the above-mentioned water-soluble additives, carbon (C) adsorbs on the substrate. When in addition cleaning with ozone water or aqueous hydrogen peroxide is carried out, the carbon concentration can be decreased below the detection limit.

Evaluation Test 4: Cleaning Properties when Hydrofluoric Acid is Added

As an additive, a condensate of naphthalenesulfonic acid and formaldehyde was diluted with pure water to give 100 ppm, and to this solution hydrochloric acid and hydrofluoric acid were added so as to give 0.5 mass % and 0.1 mass % respectively, thus preparing cleaning liquid A.

As an additive, a condensate of naphthalenesulfonic acid and formaldehyde was diluted with pure water to give 100 ppm, and to this solution hydrochloric acid was added so as to give 0.5 mass %, thus preparing cleaning liquid B.

Cleaning liquid C was prepared by diluting hydrofluoric acid to give 0.1 mass %.

Cleaning liquid D was prepared by diluting hydrofluoric acid to give 0.5 mass %.

(1) Without Ozone Water Treatment

Using a method involving immersion of a silicon substrate in a liquid reagent having silicon nitride particles dispersed therein, samples in which the silicon substrate was forcibly contaminated with silicon nitride particles were prepared. The initial number of particles was counted using the wafer surface test system. These sample wafers were immersed in cleaning liquids A to D for 3 minutes, followed by cleaning with pure water and spin drying, the number of particles after the treatment was then counted using the wafer surface test system, and the removability of particles by these cleaning liquids was evaluated. The results are given in Table 7.

Example 11 cleaning liquid A 3 minutes→rinse with pure water 15 minutes→spin dry

Example 12 cleaning liquid B 3 minutes→rinse with pure water 15 minutes→spin dry

Comparative Example 7 cleaning liquid C 3 minutes→rinse with pure water 15 minutes→spin dry

Comparative Example 8 cleaning liquid D 3 minutes→rinse with pure water 15 minutes→spin dry

[Table 7]

TABLE 7

Removal ability of particles when hydrofluoric acid is added: without ozone water treatment

| | Initial (count) | After treatment (count) | Proportion removed (%) |
|---|---|---|---|
| Example 11 | 2793 | 354 | 87.3 |
| Example 12 | 2888 | 1398 | 51.6 |
| Comp. Ex. 7 | 2943 | 1810 | 38.5 |
| Comp. Ex. 8 | 2892 | 2834 | 2.0 |

The removability was the highest for cleaning liquid A (Example 11), which comprised an additive, hydrochloric acid, and hydrofluoric acid; cleaning liquid B (Example 12), which did not contain hydrofluoric acid, and cleaning liquid C (Comparative Example 7), which comprised hydrofluoric acid alone, exhibited some degree of removability, which was inferior to that of cleaning liquid A; and cleaning liquid D (Comparative Example 8), which comprised hydrochloric acid alone, hardly showed any removability toward particles. Hydrofluoric acid etched a naturally oxidized film on a silicon substrate so as to make particles on the naturally oxidized film lift off, thus causing the particles to come off the substrate, and the additive functioned to prevent the particles from readsorbing.

(2) With Ozone Water Treatment

Sample wafers that had been forcibly contaminated with silicon nitride particles were treated with the cleaning liquids of (1) for 3 minutes, then immersed in ozone water (ozone concentration 5 ppm) for 1 minute, followed by cleaning with pure water and spin drying, the number of particles after the treatment was counted using the wafer surface test system, and the removability of particles by these cleaning liquids was evaluated. The results are given in Table 8.

Example 13 cleaning liquid A 3 minutes→ozone water 1 minute→rinse with pure water 15 minutes→spin dry Example 14 cleaning liquid B 3 minutes→ozone water 1 minute→rinse with pure water 15 minutes→spin dry Comparative Example 9 cleaning liquid C 3 minutes→ozone water 1 minute→rinse with pure water 15 minutes→spin dry Comparative Example 10 cleaning liquid D 3 minutes→ozone water 1 minute→rinse with pure water 15 minutes→spin dry

[Table 8]

TABLE 8

| Removal ability of particles when hydrofluoric acid is added: with ozone water treatment | | | |
|---|---|---|---|
| | Initial (count) | After treatment (count) | Proportion removed (%) |
| Example 13 | 2009 | 142 | 92.9 |
| Example 14 | 2090 | 981 | 53.1 |
| Comp. Ex. 9 | 2108 | 1109 | 47.4 |
| Comp. Ex. 10 | 2136 | 2074 | 2.9 |

By finishing the substrate surface so that it was hydrophilic by the treatment with ozone water, the occurrence of water marks during spin drying could be prevented, and for cleaning liquid A (Example 13) and cleaning liquid C (Comparative Example 9) in particular, which comprised hydrofluoric acid, the number of particles after the treatment could be reduced, showing excellent removability of particles.

Evaluation Test 5: Cleaning Properties from Pretreatment with Hydrofluoric Acid

Example 15 was carried out in which, in a single wafer cleaning system, a sample wafer that had been forcibly contaminated with silicon nitride particles was first sprayed with a 0.1 mass % aqueous solution of hydrofluoric acid for 20 seconds, subsequently sprayed with cleaning liquid B for 60 seconds, cleaning liquid B being formed by diluting, as an additive, a condensate of naphthalenesulfonic acid and formaldehyde with pure water to give 100 ppm and adding hydrochloric acid thereto to give 0.5 mass %, and finally water cleaned by spraying with pure water for 60 seconds, followed by spin drying.

Furthermore, Example 16 was carried out in which, in the single wafer cleaning system, a sample wafer that had been forcibly contaminated with silicon nitride particles was sprayed with cleaning liquid B for 60 seconds, cleaning liquid B being formed by diluting, as an additive, a condensate of naphthalenesulfonic acid and formaldehyde with pure water to give 100 ppm and adding hydrochloric acid thereto to give 0.5 mass %, and finally water cleaned by spraying with pure water for 60 seconds, followed by spin drying.

Moreover, Example 17 was carried out in which, in the single wafer cleaning system, a sample wafer that had been forcibly contaminated with silicon nitride particles was first sprayed with a 0.1 mass % aqueous solution of hydrofluoric acid for 20 seconds, subsequently sprayed with cleaning liquid B for 60 seconds, cleaning liquid B being formed by diluting, as an additive, a condensate of naphthalenesulfonic acid and formaldehyde with pure water to give 100 ppm and adding hydrochloric acid thereto to give 0.5 mass %, subsequently sprayed with ozone water (5 ppm) for 30 seconds, and finally water cleaned by spraying with pure water for 60 seconds, followed by spin drying.

After drying each of the sample wafers, the number of particles after treatment was counted using the wafer surface test system, and the removability of particles by these cleaning methods was evaluated. The results are given in Table 9.

[Table 9]

TABLE 9

| Removal ability of particles from pretreatment hydrofluoric acid: with ozone water treatment | | | |
|---|---|---|---|
| | Initial (count) | After treatment (count) | Proportion removed (%) |
| Example 15 | 3603 | 354 | 90.2 |
| Example 16 | 3845 | 1723 | 55.2 |
| Example 17 | 3923 | 159 | 95.9 |

By first etching a naturally oxidized film on the silicon substrate with hydrofluoric acid so as to make particles on the naturally oxidized film lift off, the particles come off the substrate, and the particles are prevented from readsorbing by the action of the additive. Furthermore, by finishing the substrate surface so that it is hydrophilic by the treatment with ozone water, the occurrence of water marks during spin drying can be prevented, and excellent removability of particles is shown.

Evaluation test 6: Effect of Carrying out Cleaning with Semiconductor Substrate Cleaning Liquid Composition in Two Stages (1) Using Sulfuric Acid as the Inorganic Acid of the Semiconductor Substrate Cleaning Liquid Composition By dropping a liquid reagent having silicon nitride particles dispersed therein onto a rotating silicon wafer, the surface of the wafer was forcibly contaminated with the silicon nitride particles.

The treatments below were carried out using a batch type cleaning machine, and the number of particles after each of the treatments was counted, thus determining the proportion removed by each treatment. The treatments below were carried out by immersing each of the wafers forcibly contaminated by the silicon nitride particles in a quartz vessel of the batch type cleaning machine.

A mixed solution of sulfuric acid and aqueous hydrogen peroxide heated at 100° C. or higher (sulfuric acid:aqueous hydrogen peroxide=90 mass %:3 mass %) was injected into a first vessel, and hot pure water at 60° C. to 70° C. was injected into a second vessel. In Example 18, a condensate of naphthalenesulfonic acid and formaldehyde was injected into the second vessel to give a concentration of 100 ppm in the vessel.

Comparative Example 11 immerse in the first vessel for 10 minutes→immerse in the second vessel and rinse with hot pure water for 10 minutes→inject ammonia solution and aqueous hydrogen peroxide for 2 minutes→rinse with pure water for 15 minutes→spin dry Example 18 immerse in the first vessel for 10 minutes →immerse in the second vessel into which the additive has been injected and rinse with hot pure water for 10 minutes inject ammonia solution and aqueous hydrogen peroxide for 2 minutes→rinse with pure water for 15 minutes→spin dry The results are given in Table 10.

[Table 10]

TABLE 10

Effect of carrying out cleaning in two stages: using sulfuric acid

|  | Initial (count) | After treatment (count) | Proportion removed (%) |
|---|---|---|---|
| Comp. Ex. 11 | 11643 | 6523 | 44.0 |
| Example 18 | 10983 | 4557 | 58.5 |

As described above, the proportion of particles removed was increased by carrying out cleaning with the semiconductor substrate cleaning liquid composition in two stages, that is, by treating with sulfuric acid and aqueous hydrogen peroxide, and then rinsing with hot pure water containing an additive. It is surmised that sulfuric acid adhering to the wafer in the first vessel is carried over into the second vessel, and the additive acts on particles under the acidic conditions of sulfuric acid, thus removing the particles effectively. Hot pure water was used in this case, but pure water at room temperature may be used. Furthermore, an organic alkaline solution may be used instead of ammonia solution. In the second vessel, a treatment with alkali and aqueous hydrogen peroxide was carried out so as to remove adsorbed additive, but when as a subsequent step there is a step that enables the additive to be removed, such as a cleaning step using ozone water, the above treatment may be omitted. When there is a possibility that the additive might be decomposed by the oxidative power of sulfuric acid and its effect might be degraded, the concentration of the additive may be set in advance at a high level.

(2) Using Phosphoric Acid as the Inorganic Acid of the Semiconductor Substrate Cleaning Liquid Composition Forcibly contaminated wafers were prepared by the same method as in (1).

The treatments below were carried out using a batch type cleaning machine, and the number of particles after treatment was measured, thus determining the proportion removed. The treatments below were carried out by immersing the wafers forcibly contaminated with silicon nitride particles in a quartz vessel of the batch type cleaning machine.

A mixed solution (85 mass %) of phosphoric acid heated at 100° C. or higher was injected into a first vessel, and hot pure water at 60° C. to 70° C. was injected into a second vessel. In Example 19, a condensate of naphthalenesulfonic acid and formaldehyde was injected into the second vessel to give a concentration of 100 ppm in the vessel. The results are given in Table 11.

Comparative Example 12 immerse in the first vessel for 10 minutes→immerse in the second vessel and rinse with hot pure water for 10 minutes→inject ammonia solution and aqueous hydrogen peroxide for 2 minutes→rinse with pure water for 15 minutes→spin dry Example 19 immerse in the first vessel for 10 minutes →immerse in the second vessel into which an additive has been injected and rinse with hot pure water for 10 minutes →inject ammonia solution and aqueous hydrogen peroxide for 2 minutes→rinse with pure water for 15 minutes→spin dry The results are given in Table 11.

[Table 11]

TABLE 11

Effect of carrying out cleaning in two stages: using phosphoric acid

|  | Initial (count) | After treatment (count) | Proportion removed (%) |
|---|---|---|---|
| Comp. Ex. 12 | 13291 | 7934 | 40.3 |
| Example 19 | 14126 | 7098 | 49.8 |

As described above, the proportion of particles removed was increased by carrying out cleaning with the semiconductor substrate cleaning liquid composition in two stages, that is, by treating with phosphoric acid, and then rinsing with hot pure water containing an additive. It is surmised that phosphoric acid adhering to the wafer in the first vessel is carried over into the second vessel, and the additive acts on particles under the acidic conditions of phosphoric acid, thus removing the particles effectively. Hot pure water was used in this case, but pure water at room temperature may be used. Furthermore, an organic alkaline solution may be used instead of ammonia solution. In the second vessel, a treatment with an alkali and aqueous hydrogen peroxide was carried out so as to remove adsorbed additive, but when as a subsequent step there is a step that enables the additive to be removed, such as a cleaning step using ozone water, the above treatment may be omitted.

Evaluation Test 7: Effect of Treatment with Ozone Water or Aqueous Hydrogen Peroxide As a pretreatment, unused Si wafers were cleaned with dilute hydrofluoric acid and cleaned with ozone water using a batch type automatic cleaning machine, thus removing a naturally oxidized film and an organic substance on the wafer surface. The treatments below were carried out using these wafers, and the amount of organic substance remaining on the surface of the wafer was then measured using a wafer thermal GC/MS analytical method. The count of each molecular weight measured was converted on a $C_{16}H_{34}$ basis to give the total amount of organic substance.

The treatments below were carried out by immersing the wafers in a quartz vessel of the batch type cleaning machine. An additive and hydrochloric acid were injected together with pure water into a treatment vessel so that the concentration in the vessel of a naphthalenesulfonic acid formaldehyde condensate as the additive was 100 ppm and the concentration of hydrochloric acid was 0.5 mass %. As ozone water, pure water in which ozone gas had been dissolved to give an ozone concentration of 5 ppm was injected into the vessel at 20 L/min. Aqueous hydrogen peroxide was injected together with pure water so that the concentration of hydrogen peroxide in the vessel was 1 mass %.

Example 20 inject the additive and hydrochloric acid for 2 minutes→inject ozone water for 5 minutes→rinse with pure water for 15 minutes→spin dry Example 21 inject the additive and hydrochloric acid for 2 minutes→inject aqueous hydrogen peroxide for 5 minutes→rinse with pure water for 15 minutes→spin dry The total amounts of organic substance measured after the treatment are given in Table 12.

[Table 12]

TABLE 12

Effect of treatment with ozone water or aqueous hydrogen peroxide

| | Total amount of organic substance (ng) |
|---|---|
| Example 20 | 20 |
| Example 21 | 22 |
| Reference (pretreatment only) | 35 |

As described above, the total amount of organic substance measured quantitatively from the treated wafer surface was less for the treatment using ozone water or aqueous hydrogen peroxide compared with the reference, and it was possible to reduce the amount of organic substance remaining on the substrate surface by the treatment using ozone water or aqueous hydrogen peroxide.

Evaluation Test 8: Effect of Pretreatment Using Ozone Water or Aqueous Hydrogen Peroxide (1) Effect of Hydrophilic Treatment Pretreatment of a wafer and measurement of the total amount of organic substance were carried out by the same method as in Evaluation test 7. A treatment of cleaning with dilute hydrofluoric acid was added to Evaluation test 7 as follows. Hydrofluoric acid was injected together with pure water to give a concentration of hydrofluoric acid of 1.5 mass % in the vessel.

Example 22 inject hydrofluoric acid for 2 minutes→rinse with pure water for 10 minutes→inject an additive and hydrochloric acid for 2 minutes→inject ozone water for 5 minutes→rinse with pure water for 15 minutes→spin dry Example 23 inject hydrofluoric acid for 2 minutes→rinse with pure water for 10 minutes→inject ozone water for 2 minutes→rinse with pure water for 5 minutes→inject an additive and hydrochloric acid for 2 minutes→inject ozone water for 5 minutes→rinse with pure water for 15 minutes→spin dry The total amounts of organic substance measured after the treatment are given in Table 13.

[Table 13]

TABLE 13

Effect of pretreatment using ozone water or aqueous hydrogen peroxide

| | Total amount of organic substance (ng) |
|---|---|
| Example 22 | 32 |
| Example 23 | 21 |
| Reference (pretreatment only) | 35 |

As described above, the total amounts of organic substance measured quantitatively from the treated wafer surfaces were reduced to a low level for both Example 22 and Example 23 compared with the reference, but it was found that the amount was lower with Example 23 into which ozone water was injected before injection of the cleaning liquid composition of the present invention. After injection of dilute hydrofluoric acid, the wafer surface was hydrophobic and a large amount of organic substance was adsorbed thereon, but by injecting ozone water before the injection of the cleaning liquid composition of the present invention so as to make the surface hydrophilic, the amount of additive adsorbing could be reduced, and the final amount of organic substance remaining could be reduced to a low level. In these examples, in both Example 22 and Example 23 rinsing with ozone water was carried out for 5 minutes after injection of the cleaning liquid composition of the present invention, but in Example 23 since the adsorption of organic substance was reduced the rinsing time could be reduced. In Example 23, the reason for injecting the cleaning liquid composition of the present invention after the ozone water has been eliminated by rinsing with pure water is that if ozone water were injected into the cleaning liquid composition of the present invention the additive in the cleaning liquid composition of the present invention would be decomposed.

(2) Effect of Cleaning Temperature

Wafers forcibly contaminated with silicon nitride were prepared by the same method as in Evaluation test 6 (1). The number of particles before treatment was counted using the wafer surface test system. The treatments below were carried out using the batch type cleaning machine, and the number of particles after the treatments was counted, thus determining the proportion removed by each of the treatments.

The treatments below were carried out by immersing the wafers forcibly contaminated with silicon nitride particles in a quartz vessel of the batch type cleaning machine. An additive and hydrochloric acid were added together with pure water to the treatment vessel so that the concentration of a naphthalenesulfonic acid formaldehyde condensate in the vessel was 100 ppm and the concentration of hydrochloric acid was 0.5 mass %. As ozone water, pure water in which ozone gas had been dissolved to give an ozone concentration of 5 ppm was injected into the vessel at 20 L/min. As hot pure water, pure water that had been heated to 60° C. to 70° C. by a clean water heater was injected into the vessel at 20 L/min.

Example 24 inject the additive, hydrochloric acid, and pure water for 2 minutes→inject ozone water for 5 minutes→rinse with pure water for 15 minutes→spin dry Example 25 inject hot pure water for 3 minutes →simultaneously inject the additive, hydrochloric acid, and hot pure water for 2 minutes→inject ozone water for 5 minutes→rinse with pure water for 15 minutes→spin dry The numbers of particles measured before and after the treatments and the proportion removed are given in Table 14.

[Table 14]

TABLE 14

Effect of cleaning temperature: with ozone water treatment

| | Initial (count) | After treatment (count) | Proportion removed (%) |
|---|---|---|---|
| Example 24 | 12167 | 10515 | 13.6 |
| Example 25 | 13421 | 10798 | 19.5 |

As described above, by increasing the temperature at which the additive is injected by using hot pure water, the proportion removed can be increased compared with a treatment at room temperature.

(3) Effect of Cleaning with Water Before Cleaning with Ozone Water

Preparation of forcibly contaminated wafers and treatments with liquid reagents were carried out by the same methods as in (2). In Example 24 of (2), a treatment by injecting pure water before the injection of ozone water after the treatment with the additive, and a treatment by maintaining an immersed state before the injection of ozone water were additionally carried out.

Example 24 inject the additive, hydrochloric acid, and pure water for 2 minutes→inject ozone water for 5 minutes→rinse with pure water for 15 minutes→spin dry Example 26 inject the additive, hydrochloric acid, and pure water for 2 minutes→inject pure water for 5 minutes→inject ozone water for 5 minutes→rinse with pure water for 15 minutes→spin dry Example 27 inject the additive, hydrochloric acid, and pure water for 2 minutes→immerse for 5 minutes → inject ozone water for 5 minutes→rinse with pure water for 15 minutes→spin dry The numbers of particles measured before and after the treatments and the proportion removed are given in Table 15.

[Table 15]

TABLE 15

Effect of cleaning with water before cleaning with ozone water

| | Initial (count) | After treatment (count) | Proportion removed (%) |
|---|---|---|---|
| Example 24 | 12167 | 10515 | 13.6 |
| Example 26 | 11813 | 10021 | 15.2 |
| Example 27 | 11791 | 10533 | 10.7 |

As described above, the proportion removed was increased by rinsing with pure water rather than by injecting ozone water immediately after injection of the additive. The removability of particles might be degraded by the additive being decomposed by the oxidative power of ozone. When carrying out immersion by suspending injection of ozone water or pure water immediately after injection of the additive, the proportion removed was unexpectedly decreased. The additive adsorbs on the surfaces of the substrate and the particles, thus controlling the zeta potential so that the substrate and the particles repel each other, and since this process proceeds rapidly, it is preferable for the removal of particles to eliminate the additive quickly by injection of pure water once adsorption has occurred.

INDUSTRIAL APPLICABILITY

The cleaning liquid composition of the present invention can remove various types of particles such as silica particles, alumina particles, and silicon nitride particles as well as metals without corroding a silicon substrate or a glass substrate.

What is claimed is:

1. A process for cleaning a semiconductor substrate, the process comprising:
    a first step of cleaning the semiconductor substrate using a semiconductor substrate cleaning liquid composition comprising one or more types selected from the group consisting of a condensate between naphthalenesulfonic acid and formaldehyde and phytic acid; one or more acids selected from the group consisting of hydrochloric acid, sulfuric acid, nitric acid, phosphoric acid, and perchloric acid; and water.

2. The process for cleaning a semiconductor substrate according to claim 1, the process comprising;
    a first step of cleaning the semiconductor substrate using a semiconductor substrate cleaning liquid composition comprising one or more types selected from the group consisting of a condensate between naphthalenesulfonic acid and formaldehyde and phytic acid; one or more acids selected from the group consisting of hydrochloric acid, sulfuric acid, nitric acid, phosphoric acid, and perchloric acid; and water; and, subsequent to the first step, a second step of cleaning the semiconductor substrate with pure water, ozone water formed by dissolving ozone gas in pure water, or aqueous hydrogen peroxide.

3. The process for cleaning a semiconductor substrate according to claim 1, wherein the first step is carried out in two steps comprising a) cleaning with an aqueous solution comprising one or more acids selected from the group consisting of hydrochloric acid, sulfuric acid, nitric acid, phosphoric acid, and perchloric acid and b) cleaning with an aqueous solution comprising one or more types selected from the group consisting of a condensate between naphthalenesulfonic acid and formaldehyde and phytic acid.

4. The process for cleaning a semiconductor substrate according to claim 1, wherein said one or more types selected from the group consisting of a condensate between naphthalenesulfonic acid and formaldehyde and phytic acid is in the range of 0.00001 to 10 mass % as a total.

5. The process for cleaning a semiconductor substrate according to claim 1, wherein the first step is carried out by heating.

6. The process for cleaning a semiconductor substrate according to claim 1 wherein, prior to the first step, cleaning is carried out with ozone water formed by dissolving ozone gas in pure water, or aqueous hydrogen peroxide.

7. The process for cleaning a semiconductor substrate according to claim 2, wherein between the first step and the second step cleaning is carried out with pure water.

8. The process for cleaning a semiconductor substrate according to claim 1, wherein prior to the first step, cleaning is carried out with hydrofluoric acid.

9. The process for cleaning a semiconductor substrate according to claim 1, wherein the semiconductor substrate cleaning liquid composition of the first step further comprises hydrofluoric acid.

10. The process for cleaning a semiconductor substrate according to claim 1, wherein the semiconductor substrate cleaning liquid composition of the first step further comprises hydrogen peroxide.

* * * * *

UNITED STATES PATENT AND TRADEMARK OFFICE
CERTIFICATE OF CORRECTION

PATENT NO. : 7,896,970 B2
APPLICATION NO. : 11/893752
DATED : March 1, 2011
INVENTOR(S) : Hiroshi Tomita et al.

It is certified that error appears in the above-identified patent and that said Letters Patent is hereby corrected as shown below:

On the title page:

(73) Assignees: Kabushiki Kaisha Toshiba, Tokyo (JP);
Kanto Kagaku Labushiki Kaisha, Tokyo (JP);

Please Delete "Labushiki" and insert -- Kabushiki --.

Signed and Sealed this
Tenth Day of May, 2011

David J. Kappos
*Director of the United States Patent and Trademark Office*